US006982583B2

(12) United States Patent
Yin et al.

(10) Patent No.: US 6,982,583 B2
(45) Date of Patent: *Jan. 3, 2006

(54) CURRENT-CONTROLLED CMOS CIRCUIT USING HIGHER VOLTAGE SUPPLY IN LOW VOLTAGE CMOS PROCESS

(75) Inventors: Guangming Yin, Foothill Ranch, CA (US); Ichiro Fujimori, Irvine, CA (US); Armond Hairapetian, Newport Coast, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/876,790

(22) Filed: Jun. 25, 2004

(65) Prior Publication Data

US 2004/0227544 A1 Nov. 18, 2004

Related U.S. Application Data

(63) Continuation of application No. 10/229,257, filed on Aug. 26, 2002, now Pat. No. 6,897,697, which is a continuation-in-part of application No. 10/143,087, filed on May 9, 2002, now Pat. No. 6,900,670, which is a continuation of application No. 09/484,856, filed on Jan. 18, 2000, now Pat. No. 6,424,194.

(60) Provisional application No. 60/141,355, filed on Jun. 28, 1999.

(51) Int. Cl.
 *H03K 3/356* (2006.01)

(52) U.S. Cl. .................. 327/210; 327/219; 327/117; 327/119

(58) Field of Classification Search ......... 327/201–203, 327/207, 208, 210–212, 214, 215, 219, 223, 327/115–120; 377/47, 48; 326/95–98, 108–110, 326/121, 122
See application file for complete search history.

(56) References Cited

U.S. PATENT DOCUMENTS

| 4,449,248 A | 5/1984 | Leslie et al. |
| 4,519,068 A | 5/1985 | Krebs et al. |
| 4,545,023 A | 10/1985 | Mizzi |

(Continued)

OTHER PUBLICATIONS

Yamashina et al., A Low–Supply Voltage GHz MOS Integrated Circuit for Mobile Computing System, 1994 IEEE Symposium on Low Power Electronics, pp. 80–81.*

Bida, A Hybrid Wireless MAC Protocol Supporting Asynchronous and Synchronous MSDU Delivery Services, IEEE 802.11/91–92, Sep. 1991, pp. 1–46.

Robert Meier's Master's Thesis, Mobile Computer Network Architecture, (May 1993), 82 pages.

(Continued)

*Primary Examiner*—Timothy P. Callahan
*Assistant Examiner*—Hai L. Nguyen
(74) *Attorney, Agent, or Firm*—Garlick Harrison & Markison LLP; Shayne X. Short

(57) ABSTRACT

Various circuit techniques for implementing ultra high speed circuits use current-controlled CMOS ($C^3MOS$) logic fabricated in conventional CMOS process technology. An entire family of logic elements including inverter/buffers, level shifters, NAND, NOR, XOR gates, latches, flip-flops and the like are implemented using $C^3MOS$ techniques. Optimum balance between power consumption and speed for each circuit application is achieve by combining high speed $C^3MOS$ logic with low power conventional CMOS logic. The combined $C^3MOS$/CMOS logic allows greater integration of circuits such as high speed transceivers used in fiber optic communication systems. The $C^3MOS$ structure enables the use of a power supply voltage that may be larger than the voltage required by the CMOS fabrication process, further enhancing the performance of the circuit.

20 Claims, 11 Drawing Sheets

U.S. PATENT DOCUMENTS

| | | |
|---|---|---|
| 4,680,787 A | 7/1987 | Marry |
| 4,731,796 A | 3/1988 | Masterton et al. |
| 4,737,975 A | 4/1988 | Shafer |
| 4,761,822 A | 8/1988 | Maile |
| 4,777,657 A | 10/1988 | Gillaspie |
| 4,794,649 A | 12/1988 | Fujiwara |
| 4,804,954 A | 2/1989 | Macnak et al. |
| 4,807,282 A | 2/1989 | Kazan et al. |
| 4,817,115 A | 3/1989 | Campo et al. |
| 4,850,009 A | 7/1989 | Zook et al. |
| 4,890,832 A | 1/1990 | Komaki |
| 4,894,792 A | 1/1990 | Mitchell et al. |
| 4,916,441 A | 4/1990 | Gombrich |
| 4,964,121 A | 10/1990 | Moore |
| 4,969,206 A | 11/1990 | Desrochers |
| 4,977,611 A | 12/1990 | Maru |
| 4,995,099 A | 2/1991 | Davis |
| 5,008,879 A | 4/1991 | Fischer et al. |
| 5,025,486 A | 6/1991 | Klughart |
| 5,029,183 A | 7/1991 | Tymes |
| 5,031,231 A | 7/1991 | Miyazaki |
| 5,033,109 A | 7/1991 | Kawano et al. |
| 5,055,659 A | 10/1991 | Hendrick et al. |
| 5,055,660 A | 10/1991 | Bertagna et al. |
| 5,081,402 A | 1/1992 | Koleda |
| 5,087,099 A | 2/1992 | Stolarczyk |
| 5,117,501 A | 5/1992 | Childress et al. |
| 5,119,502 A | 6/1992 | Kallin et al. |
| 5,121,408 A | 6/1992 | Cai et al. |
| 5,123,029 A | 6/1992 | Bantz et al. |
| 5,128,938 A | 7/1992 | Borras |
| 5,134,347 A | 7/1992 | Koleda |
| 5,142,573 A | 8/1992 | Umezawa |
| 5,150,361 A | 9/1992 | Wieczorek et al. |
| 5,152,006 A | 9/1992 | Klaus |
| 5,153,878 A | 10/1992 | Krebs |
| 5,175,870 A | 12/1992 | Mabey et al. |
| 5,179,721 A | 1/1993 | Comroe et al. |
| 5,181,200 A | 1/1993 | Harrison |
| 5,230,084 A | 7/1993 | Nguyen |
| 5,239,662 A | 8/1993 | Danielson et al. |
| 5,241,542 A | 8/1993 | Natarajan et al. |
| 5,241,691 A | 8/1993 | Owen |
| 5,249,220 A | 9/1993 | Moskowitz et al. |
| 5,249,302 A | 9/1993 | Metroka et al. |
| 5,265,238 A | 11/1993 | Canova, Jr. et al. |
| 5,265,270 A | 11/1993 | Stengel et al. |
| 5,274,666 A | 12/1993 | Dowdell et al. |
| 5,276,680 A | 1/1994 | Messenger |
| 5,278,831 A | 1/1994 | Mabey et al. |
| 5,289,469 A | 2/1994 | Tanaka |
| 5,291,516 A | 3/1994 | Dixon et al. |
| 5,293,639 A | 3/1994 | Wilson et al. |
| 5,296,849 A | 3/1994 | Ide |
| 5,297,144 A | 3/1994 | Gilbert et al. |
| 5,323,392 A | 6/1994 | Ishii et al. |
| 5,331,509 A | 7/1994 | Kikinis |
| 5,345,449 A | 9/1994 | Buckingham et al. |
| 5,349,649 A | 9/1994 | Iijima |
| 5,361,397 A | 11/1994 | Wright |
| 5,363,121 A | 11/1994 | Freund |
| 5,373,149 A | 12/1994 | Rasmussen |
| 5,373,506 A | 12/1994 | Tayloe et al. |
| 5,390,206 A | 2/1995 | Rein et al. |
| 5,392,023 A | 2/1995 | D'Avello et al. |
| 5,406,615 A | 4/1995 | Miller, II et al. |
| 5,406,643 A | 4/1995 | Burke et al. |
| 5,418,837 A | 5/1995 | Johansson et al. |
| 5,420,529 A | 5/1995 | Guay et al. |
| 5,423,002 A | 6/1995 | Hart |
| 5,426,637 A | 6/1995 | Derby et al. |
| 5,428,636 A | 6/1995 | Meier |
| 5,430,845 A | 7/1995 | Rimmer et al. |
| 5,438,329 A | 8/1995 | Gastouniotis et al. |
| 5,440,560 A | 8/1995 | Rypinski |
| 5,465,081 A | 11/1995 | Todd |
| 5,481,265 A | 1/1996 | Russell |
| 5,481,562 A | 1/1996 | Pearson et al. |
| 5,533,029 A | 7/1996 | Gardner |
| 5,535,373 A | 7/1996 | Olnowich |
| 5,544,222 A | 8/1996 | Robinson et al. |
| 5,579,487 A | 11/1996 | Meyerson et al. |
| 5,584,048 A | 12/1996 | Wieczorek |
| 5,628,055 A | 5/1997 | Stein |
| 5,630,061 A | 5/1997 | Richter et al. |
| 5,675,584 A | 10/1997 | Jeong |
| 5,680,633 A | 10/1997 | Koenck et al. |
| 5,724,361 A | 3/1998 | Fiedler |
| 5,732,346 A | 3/1998 | Lazaridis et al. |
| 5,740,366 A | 4/1998 | Mahany et al. |
| 5,744,366 A | 4/1998 | Kricka et al. |
| 5,767,699 A | 6/1998 | Bosnyak et al. |
| 5,796,727 A | 8/1998 | Harrison et al. |
| 5,798,658 A | 8/1998 | Werking |
| 5,839,051 A | 11/1998 | Grimmett et al. |
| 5,940,771 A | 8/1999 | Gollnick et al. |
| 5,945,858 A * | 8/1999 | Sato ......................... 327/202 |
| 5,952,847 A * | 9/1999 | Plants et al. .................. 326/80 |
| 6,014,705 A | 1/2000 | Koenck et al. |
| 6,028,454 A * | 2/2000 | Elmasry et al. ............. 326/115 |
| 6,038,254 A | 3/2000 | Ferraiolo et al. |
| 6,061,747 A | 5/2000 | Ducaroir et al. |
| 6,094,074 A | 7/2000 | Chi et al. |
| 6,111,425 A * | 8/2000 | Bertin et al. ................... 326/21 |
| 6,111,437 A * | 8/2000 | Patel ........................... 327/74 |
| 6,188,339 B1 | 2/2001 | Hasegawa |
| 6,194,950 B1 | 2/2001 | Kibar et al. |
| 6,222,380 B1 | 4/2001 | Gerowitz et al. |
| 6,232,844 B1 * | 5/2001 | Talaga, Jr. .................... 331/57 |
| 6,242,949 B1 * | 6/2001 | Wilford ....................... 326/81 |
| 6,265,898 B1 | 7/2001 | Bellaouar |
| 6,374,311 B1 | 4/2002 | Mahany et al. |
| 6,424,194 B1 * | 7/2002 | Hairapetian .................. 327/210 |
| 6,463,092 B1 | 10/2002 | Kim et al. |
| 6,525,571 B2 * | 2/2003 | Green ........................ 326/115 |
| 6,559,685 B2 * | 5/2003 | Green ........................ 327/57 |

OTHER PUBLICATIONS

Hoberecht, A Layered network Protocol for Packet Voice and Data Integration, IEEE Journal on Selected Areas in Communications, vol. SAC-1, No. 6 (Dec. 1983), pp. 1006–1013.

Rypinski, Architecture–Topology and Protocol Stacks, IEEE 802.11/91–21, Mar. 1991, 12 pages.

Cheah, A Proposed Architecture and Access Protocol Outline for the IEEE 802.11 Radio LAN Standards, Document IEEE P802.11/91–54, May 1991; pp. 1–20.

Rypinski, Power–Drain Considerations for Full Time and Sleep Mode Radio Receivers, IEEE P802.11/91–99, Sep. 1991, 11 pages.

Natarajan et al, Battery Efficient Operation of Radio MAC Protocol, IEEE P802.11/91–102, Sep. 1991, pp. 1–5.

Cox, A Radio System Proposal for Widespread Low–Power Tetherless Communications, IEEE Transactions on Communications, vol. 39, No. 2 (Feb. 1991), pp. 324–335.

Bagby, One Approach to Wireless Network Architecture, IEEE P802.11/91–2, Jan. 1991, 1–15, 17–21.

Biba, A Modest Proposal for a Asynchronous, Data Intensive, Wireless Local Area Network, IEEE P802.11/91–25, Mar. 1991; pp. 1–25.

Heimschi et al; Merged CMOS/Bipolar Current Switch Logic (MCSL), IEEE Journal of Solid State Circuits, vol. 24, pp. 1307–1311, Oct. 1989, p. 1307–1311.

Elrabaa et al; Optimization of Digital BiCMOS Circuits, An Overview, IEEE 1992, 5 pages.

Mudd et al, Very High Speed ECL/CMG Gate Arrays with Submicron Structures; IEEE 1989, 5 pages.

Atkinson, A Single Chip Radio Transceiver for DECT, IEEE 1997.

Mizuno, A GHzMOS Adaptive Pipeline Technique Using MOS Curren–Mode Logic, IEEE Journal of Solid–State Circuits, vol. 31, No. 6, pp 784–791 (Jun. 1996).

Klose, Process–Optimization for Sub–3Ops BiCMOS Technologies for Mixed ECL/CMOS Applications, IEEE 1991.

Heimsch, Merged CMOS/Bipolar Current Switch Logic (MCSL), IEEE Journal of Solid–State Circuits, vol. 24, No. 5, pp. 1307–1311 (Oct. 1989).

Elrabaa, Optimization of Digital BiCMOS Circuit, An Overview, IEEE 1992.

Elrabaa, Multimitter BiCMOS CML Circuits, IEEE Journal of Solid–State Circuits, vol. 27, No. 3, pp. 454–458 (Mar. 1992).

Ewen et al., Single–Chip 1062Mbaud CMOS Transceiver for Serial Data Communication, 1995 IEEE International Solid–State Circuits Conference Digest of Technical Papers, pp. 32–33, 336.

Chen and Waldron, A Single–Chip 266Mb/s CMOS Transmitter/Receiver for Serial Date Communications, 1993 IEEE International Solid–State Circuits Conference Digest of Technical Papers, pp 100–01, 269.

Oshima et al., A Single CMOS SDH Terminal Chip for 622 Mb/s STM 4C, 1994 IEEE International Solid–State Circuits Conference Digest of Technical Papers, pp. 174–175.

Widmer et al., Single–Chip 4×500Mbaud CMOS Transceiver, 1996 IEEE International Solid–State Circuits Conference Digest of Technical Papers, pp. 126–127, 430.

Lee et al., A CMOS Serial Link for 1 Gbaud Fully Duplexed Data Communication, 1994 Symposium on VLSI Circuits Digest of Technical Papers, pp. 125–126.

Lee et al., A CMOS Serial Link for Fully Duplexed Data Communication, IEEE Journal of Solid–State Circuits, vol. 30, pp. 353–364 (Apr. 1995).

Djahanshahi et al., High–speed ECL–Compatible Serial I/O in 0.35$\mu$m CMOS, IEEE 1998.

Fukaishi et al., A 4.25–Gb/s CMOS Fiber Channel Transceiver with Asynchronous Tree–Type Demultiplexer and Frequency Conversion Architecture, IEEE Journal of Solid–state Circuits, vol. 33 No. 12, pp. 2139–2147 (1998).

Madhavan and Levi, Low–Power 2.5 Gbit/s VCSEL driver in 0.5$\mu$m CMOS technology, Electronics Letters, vol. 34 No. 2 pp. 178–179 (Jan. 1998).

Chen and Baker, A 1.25Gb/s, 460mW CMOS Transceiver for Serial Data Communication, 1997 IEEE International Solid–state Circuits Conference pp. 242–243, 465.

Runge and Thomas, 5Gbit/s 2:1 multiplexer fabricated in 0.35$\mu$m CMOS and 3Gbit/s 1:2 demultiplexer fabricated in 0.5$\mu$m CMOS technology, Electronics Letters, vol. 35 No. 19.pp. 163 1–33 (Sep. 1999).

Fiedler et al., A 1.0625Gbps Transceiver with 2x–Oversampling and Transmit Signal Pre–Emphasis, 1997 IEEE International Solid–state Circuits Conference pp. 238–239, 464.

Widmer et al., Single–Chip 4 × 500–MEd CMOS Transceiver, IEEE Journal of Solid–state Circuits, vol. 31 No. 12 pp. 2004–2014 (1996).

Kurisu et al., 2.8Gb/s 176mW Byte–Interleaved and 3.0 Gb/s 118mW Bit–Interleaved 8:1 Multiplexers, 1996 International Solid state Circuits Conference pp. 122–123, 429.

Friedman et al, A Baseband Processor for IS–54 Cellular Telephony, IEEE Journal of Solid–state Circuits, vol. 31 No. 5 pp. 646–655 (May 1996).

Ewen et al., CMOS circuits for Gb/s serial data communication, IBM J. Res. Develop., vol. 39 No. 12 pp. 73–81 (Mar. 1995).

Thompson et al., A 300–MHz BiCMOS Serial Data Transceiver, IEEE Journal of Solid–state Circuits, vol. 29 No. 3 pp. 185–192 (1994).

Yuen et al., An ECL Gate Array with 2.5 GHz Embedded PLL, IEEE 1993.

Quigley et al., Current Mode Transceiver Logic, (CMTL) for Reduced Swing CMOS, Chip to Chip Communication, IEEE 1993.

Dunlop et al., A 9 Gbit/s Bandwidth MultiplexerfDemultiplexer CMOS Chip, 1992 Symposium on VLSI Circuits Digest of Technical Papers pp. 68–69.

Navarro and Van Noije, Design of an 8:1 MUX at 1.7Gbit/s in 0.8$\mu$m CMOS Technolgy, 1998 Great Lakes Symposium on VLSI.

Pederson and Metz, A CMOS to 100K ECL Interface Circuit, 1989 IEEE International Solid–state Circuits Conference pp. 226–227, 345.

Baumert et al., A Monolithic 50–200 MHz CMOS Clock Recovery and Retiming Circuit, IEEE 1989 Custom Integrated Circuits Conference pp. 14.5.1–14.5.4 (May 1989).

* cited by examiner

CURRENT-CONTROLLED CMOS CIRCUIT USING HIGHER VOLTAGE SUPPLY IN LOW VOLTAGE CMOS PROCESS

CROSS REFERENCE TO RELATED PATENTS/PATENT APPLICATIONS

The present U.S. Utility Patent Application is a continuation of U.S. Utility patent application Ser. No. 10/229,257, entitled "CURRENT-CONTROLLED CMOS CIRCUIT USING HIGHER VOLTAGE SUPPLY IN LOW VOLTAGE CMOS PROCESS," filed Aug. 26, 2002, pending, which is hereby incorporated herein by reference in its entirety and made part of the present U.S. Utility Patent Application for all purposes.

The U.S. Utility patent application Ser. No. 10/229,257, filed Aug. 26, 2002, now U.S. Pat. No. 6,897,697, is a Continuation-in-Part of U.S. patent application Ser. No. 10/143,087, filed May 9, 2002, now U.S. Pat. No. 6,900,670 which is a Continuation of U.S. patent application Ser. No. 09/484,856, filed Jan. 18, 2000, now U.S. Pat. No. 6,424,194 B1, which claims priority from U.S. Provisional Patent Application Ser. No. 60/141,355, filed Jun. 28, 1999, the disclosures of which are each incorporated herein by reference for all purposes.

BACKGROUND OF THE INVENTION

The present invention relates in general to integrated circuitry, and in particular to complementary metal-oxide-semiconductor (CMOS) logic and circuits with enhanced speed characteristics.

For a number of reasons CMOS is the logic family of choice in today's VLSI devices. Due to the complementary nature of its operation, CMOS logic consumes near zero static power. CMOS also readily scales with technology. These two features are highly desirable given the drastic growth in demand for low power and portable electronic devices. Further, with the computer aided design (CAD) industry's focus on developing automated design tools for CMOS based technologies, the cost and the development time of CMOS VLSI devices has reduced significantly.

The one drawback of the CMOS logic family, however, remains its limited speed. That is, conventional CMOS logic has not achieved the highest attainable switching speeds made possible by modern sub-micron CMOS technologies. This is due to a number of reasons. Referring to FIG. 1, there is shown a conventional CMOS inverter 100—the most basic building block of CMOS logic. A p-channel transistor 102 switches between the output and the positive power supply Vcc, and an n-channel transistor 104 switches between the output and the negative power supply (or ground). The switching speed in CMOS logic is inversely proportional to the average on resistance (Ron) of the MOS transistor, and the load capacitance CL on a given node ($\tau = Ron \times C_L$). The on resistance Ron is proportional to the transistor channel length L divided by the power supply voltage (i.e., Ron∝L/Vcc), while the load capacitance is given by the gate capacitance of the transistor being driven (i.e., With X L X Cox, where Cox is the gate oxide capacitance), plus the interconnect parasitic capacitance Cint. Therefore, with reduced transistor channel lengths L, the switching speed is generally increased.

This relationship, however, no longer holds in sub-micron technologies. As the channel length L in CMOS technology shrinks into the sub-micron range, the power supply voltage must be reduced to prevent potential damage to the transistors caused by effects such as oxide breakdown and hot-electrons. The reduction of the power supply voltage prevents the proportional lowering of Ron with the channel length L. Moreover, the load capacitance which in the past was dominated by the capacitances associated with the MOS device, is dominated by the routing or interconnect capacitance ($C_{in}$) modern sub 0.5 micron technologies. This means that the load capacitance will not be reduced in proportion with the channel length L. Thus, the RC loading which is the main source of delaying the circuit remains relatively the same as CMOS technology moves in the sub-micron range.

Furthermore, modern sub-micron CMOS process technologies such as a 0.13 $\mu$ process, require lower power supply voltages (e.g., 1.2 volts) for reliability concerns. The lower power supply voltages, which are characteristic of these sub-micron CMOS processes, limit the current density or the transconductance of the MOS transistor rendering the devices even slower.

As a result of the speed limitations of conventional CMOS logic, integrated circuit applications in the Giga Hertz frequency range have had to look to alternative technologies such as ultra high speed bipolar circuits and Gallium Arsenide (GaAs). These alternative technologies, however, have drawbacks of their own that have made them more of a specialized field with limited applications as compared to silicon MOSFET that has had widespread use and support by the industry. In particular, compound semiconductors such as GaAs are more susceptible to defects that degrade device performance, and suffer from increased gate leakage current and reduced noise margins. Furthermore, attempts to reliably fabricate a high quality oxide layer using GaAs have not thus far met with success. This has made it difficult to fabricate GaAs FETs, limiting the GaAs technology to junction field-effect transistors (JFETs) or Schottky barrier metal semiconductor field-effect transistors (MESFETs). A major drawback of the bipolar technology, among others, is its higher current dissipation even for circuits that operate at lower frequencies.

It is therefore highly desirable to develop integrated circuit design techniques that are based on conventional silicon CMOS technology, but overcome the speed limitations of CMOS logic.

BRIEF SUMMARY OF THE INVENTION

The present invention provides a new family of CMOS logic that is based on current-controlled mechanism to maximize speed of operation. The current-controlled CMOS (or C³MOS™) logic family according to the present invention includes all the building blocks of any other logic family. The basic building block of the C³MOS logic family uses a pair of conventional MOSFETs that steer current between a pair of load devices in response to a difference between a pair of input signals. Thus, unlike conventional CMOS logic, C³MOS logic according to this invention dissipates static current, but operates at much higher speeds. The structure of a typical C³MOS logic block according to the present invention stacks more than a couple of devices between the power supplies. This extends the power supply range of the circuit allowing it to operate at a supply voltage that can be higher than the voltage the CMOS process can tolerate. The higher power supply voltage further enhances the speed of the circuit. In one embodiment, the present invention combines C³MOS logic with CMOS logic within the same integrated circuitry, where C³MOS is utilized in high speed sections and CMOS is used in the lower speed parts of the circuit. In another embodiment, a higher power supply voltage is used for the C³MOS section of the circuit while a lower power supply voltage is used for the conventional CMOS logic circuitry.

Accordingly, in one embodiment, the present invention provides a metal-oxide-semiconductor field-effect transistor (MOSFET) circuit fabricated on a silicon substrate, comprising: first circuitry implemented using current-controlled complementary metal-oxide semiconductor C³MOS logic wherein logic levels are signaled by current steering in one of two or more branches in response to differential input signals, the first circuitry being configured to process a first signal having a first frequency; and second circuitry implemented using conventional complementary metal-oxide-semiconductor (CMOS) logic wherein substantially zero static current is dissipated, the second circuitry being coupled to the first circuitry and configured to process a second signal having a second frequency that is different than the first frequency, wherein the first circuitry is coupled to a first power supply voltage and the second circuitry is coupled to a second power supply voltage that is different than the first power supply voltage.

In a specific implementation of the above embodiment, the first power supply voltage is higher in magnitude than the second power supply voltage. In yet another specific implementation, the second power supply voltage is the maximum power supply voltage specified by CMOS process used to fabricate the circuit. In another specific embodiment, the second power supply voltage is generated on-chip from the first power supply voltage. In this embodiment the circuit further includes a voltage generator that is configured to receive the first power supply voltage and to generate the second power supply voltage.

The following detailed description with the accompanying drawings provide a better understanding of the nature and advantages of the current-controlled CMOS logic according to the present invention.

DETAILED DESCRIPTION OF THE INVENTION

The present invention provides ultra high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide. CMOS logic, on the other hand, refers to the use of complementary CMOS transistors (n-channel and p-channel) to form various logic gates and more complex logic circuitry, wherein zero static current is dissipated. The present invention uses current-controlled mechanisms to develop a family of very fast current-controlled CMOS (or C³MOS™) logic that can be fabricated using a variety of conventional CMOS process technologies, but that unlike conventional CMOS logic does dissipate static current. C³MOS logic or current-controlled metal-oxide-semiconductor field-effect transistor (MOSFET) logic are used herein interchangeably.

Figure 2:
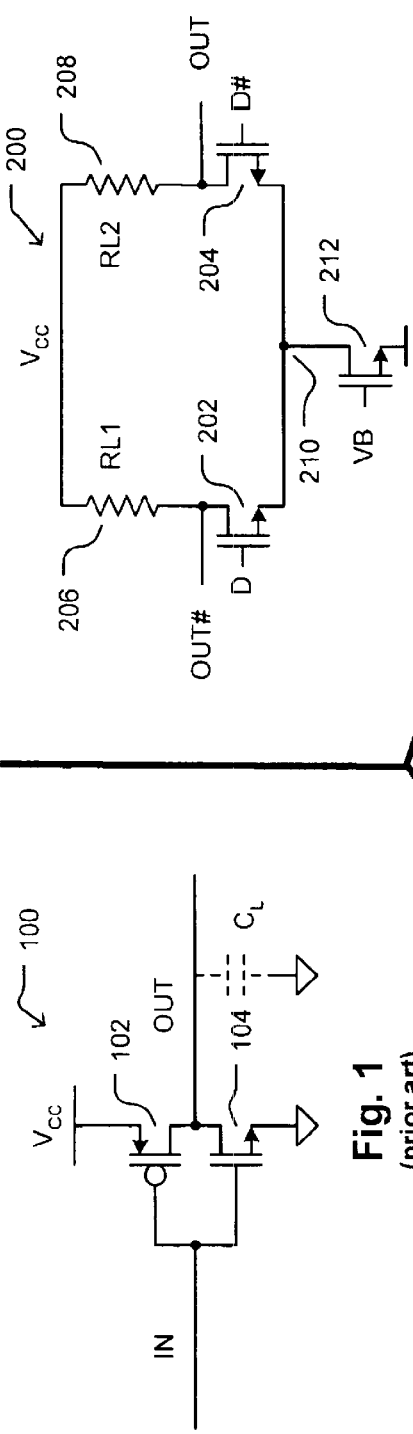
FIG. 2 is an inverter/buffer implemented in C³MOS according to an exemplary embodiment of the present invention.

In a preferred embodiment, the basic building block of this logic family is an NMOS differential pair with resistive loads. Referring to FIG. 2, there is shown one embodiment for the basic C³MOS inverter/buffer 200 according to the present invention. Inverter/buffer 200 includes a pair of n-channel MOSFETs 202 and 204 that receive differential logic signals D and D# at their gate terminals, respectively. Resistive loads 206 and 208 connect the drain terminals of MOSFETs 202 and 204, respectively, to the power supply Vcc. Drain terminals of MOSFETs 202 and 204 form the outputs OUT# and OUT of the inverter/buffer, respectively. Resistive loads 206 and 208 may be made up of either p-channel MOSFETs operating in their linear region, or resistors made up of, for example, polysilicon material. In a preferred embodiment, polysilicon resistors are used to implement resistive loads 206 and 208, which maximize the speed of inverter/buffer 200. The source terminals of n-channel MOSFETs 202 and 204 connect together at node 210. A current-source n-channel MOSFET 212 connects node 210 to ground (or negative power supply). A bias voltage VB drives the gate terminal of current-source MOSFET 212 and sets up the amount of current I that flows through inverter/buffer 200. In response to the differential signal at D and D#, one of the two input n-channel MOSFETs 202 and 204 switches on while the other switches off. All of current I, thus flows in one leg of the differential pair pulling the drain terminal (OUT or OUT#) of the on transistor down to logic low, while the drain of the other (off) transistor is pulled up by its resistive load toward logic high. At the OUT output this circuit is a buffer, while at the OUT# output the circuit acts as an inverter.

Figure 1:
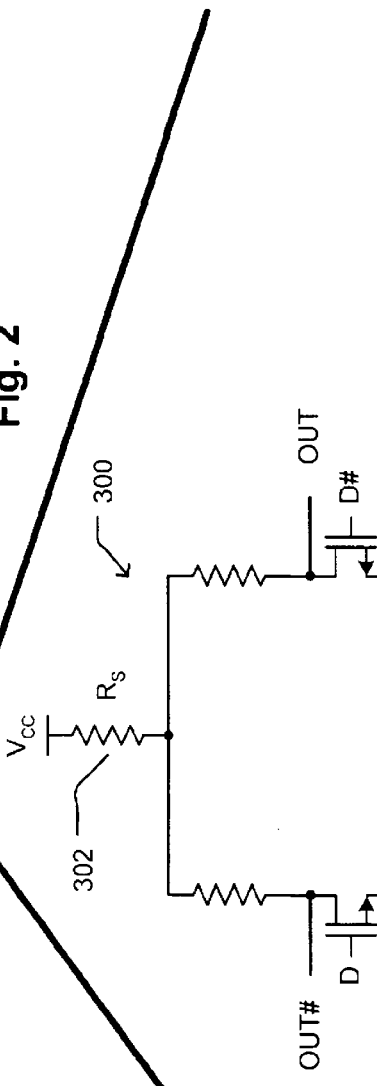
FIG. 1 shows a conventional CMOS inverter.

Significant speed advantages are obtained by this type of current steering logic. Unlike the conventional CMOS inverter of FIG. 1, when either one of the input MOSFETs 202 or 204 is switching on, there is no p-channel pull-up transistor that fights the n-channel. Further, circuit 200 requires a relatively small differential signal to switch its transistors. This circuit also exhibits improved noise performance as compared to the CMOS inverter of FIG. 1, since in the C3MOS inverter/buffer, transistors do not switch between the power supply and the substrate. Logic circuitry based on current-steering techniques have been known in other technologies such as bipolar, where it is called emitter-coupled logic (ECL), and GaAs where it is called source-coupled FET logic (SCFL). This technique, however, has not been seen in silicon CMOS technology for a number of reasons, among which is the fact that CMOS logic has always been viewed as one that dissipates zero static current. The C$^3$MOS logic as proposed by the present invention, on the other hand, does dissipate static current.

The design of each C$^3$MOS logic cell according to the present invention is optimized based on several considerations including speed, current dissipation, and voltage swing. The speed of the logic gate is determined by the resistive load and the capacitance being driven. As discussed above, the preferred embodiment according to the present invention uses polysilicon resistors to implement the load devices. P-channel MOSFETs can alternatively be used, however, they require special biasing to ensure they remain in linear region. Further, the junction capacitances of the p-channel load MOSFETs introduce undesirable parasitics. Speed requirements place a maximum limit on the value of the resistive loads. On the other hand, the various C$^3$MOS logic cells are designed to preferably maintain a constant voltage swing (I×R). Accordingly, the values for R and I are adjusted based on the capacitive load being driven to strike the optimum trade-off between switching speed and power consumption.

Figure 3:
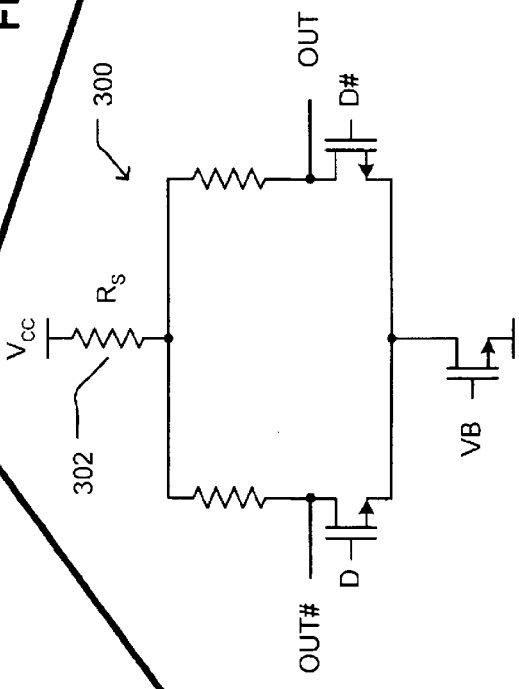
FIG. 3 shows an exemplary C³MOS level shift buffer according to the present invention.

The C$^3$MOS logic family, according to the present invention, contains all the building blocks of other logic families. Examples of such building blocks include inverters, buffers, level shift buffers, N-input NOR and NAND gates, exclusive OR (XOR) gates, flip flops and latches, and the like. FIG. 3 shows an exemplary C$^3$MOS level shift circuit 300 according to the present invention. Level shift circuit 300 includes essentially the same circuit elements as inverter/buffer 200 shown in FIG. 2, with an additional resistor Rs 302 inserted between the power supply Vcc and the load resistors. Circuit 300 operates in the same fashion as inverter/buffer 200 except that it has its power supply voltage shifted by a value equal to (I×Rs). The C$^3$MOS logic circuitry according to the present invention employs this type of level shifter to make the necessary adjustments in the signal level depending on the circuit requirements. Examples of C$^3$MOS circuits utilizing this type of level shifting will be described below in connection with other types of C$^3$MOS logic elements.

Figures 4A, 4B:
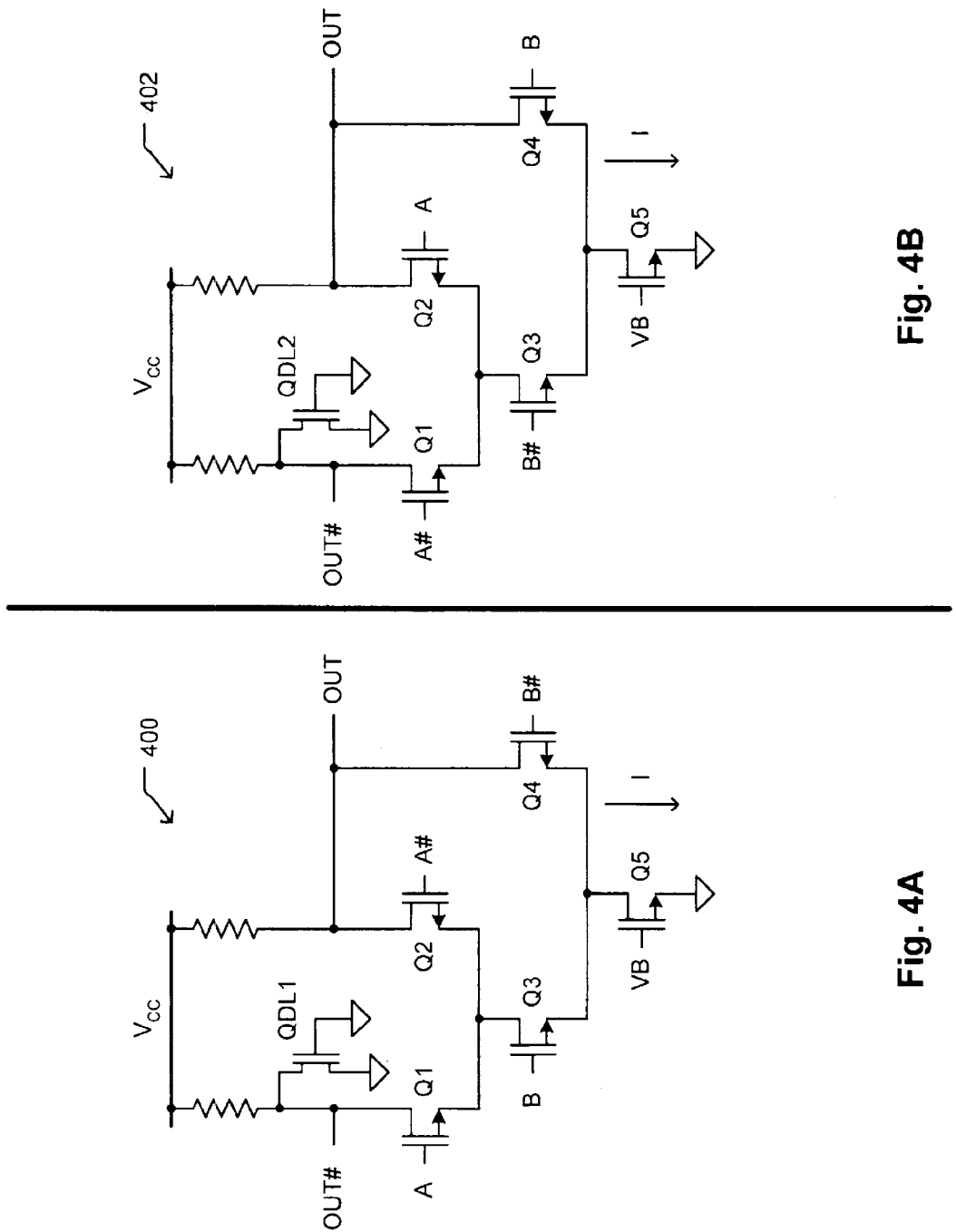
FIGS. 4A and 4B show exemplary C³MOS implementations for an AND/NAND gate and an OR/NOR gate, respectively.

FIGS. 4A and 4B show exemplary C$^3$MOS implementations for an exemplary 2-input AND/NAND gate 400 and an exemplary 2-input OR/NOR gate 402, respectively. These gates operate based on the same current steering principal as discussed above. A logic low signal at input B of AND/NAND gate 400 brings OUT to ground via Q4 while OUT# is pulled high by its load resistor. A logic low at the A input also pulls OUT to ground via Q2 and Q3 (B=high). OUT is pulled high only when both A and B are high disconnecting any path to ground. OUT# provides the inverse of OUT. OR/NOR gate 402 operates similarly to generate OR/NOR logic at its outputs. When another set of transistors are inserted in each leg of the differential pair as is the case for gates 400 and 402, the signals driving the inserted transistors (Q3, Q4) need level shifting to ensure proper switching operation of the circuit. Thus, high speed C$^3$MOS level shifters such as those presented in FIG. 3 can be employed to drive signals B and B#. In a preferred embodiment, since node OUT in both gates 400 and 402 must drive the additional parasitics associated transistors Q4, dummy load transistors DQL1 and DQL2 connect to node OUT# to match the loading conditions at both outputs. The gate and source terminals of the dummy transistors can be either connected to ground as shown, or connected to some other voltage depending on the circuit and process voltage requirements.

Figure 5:
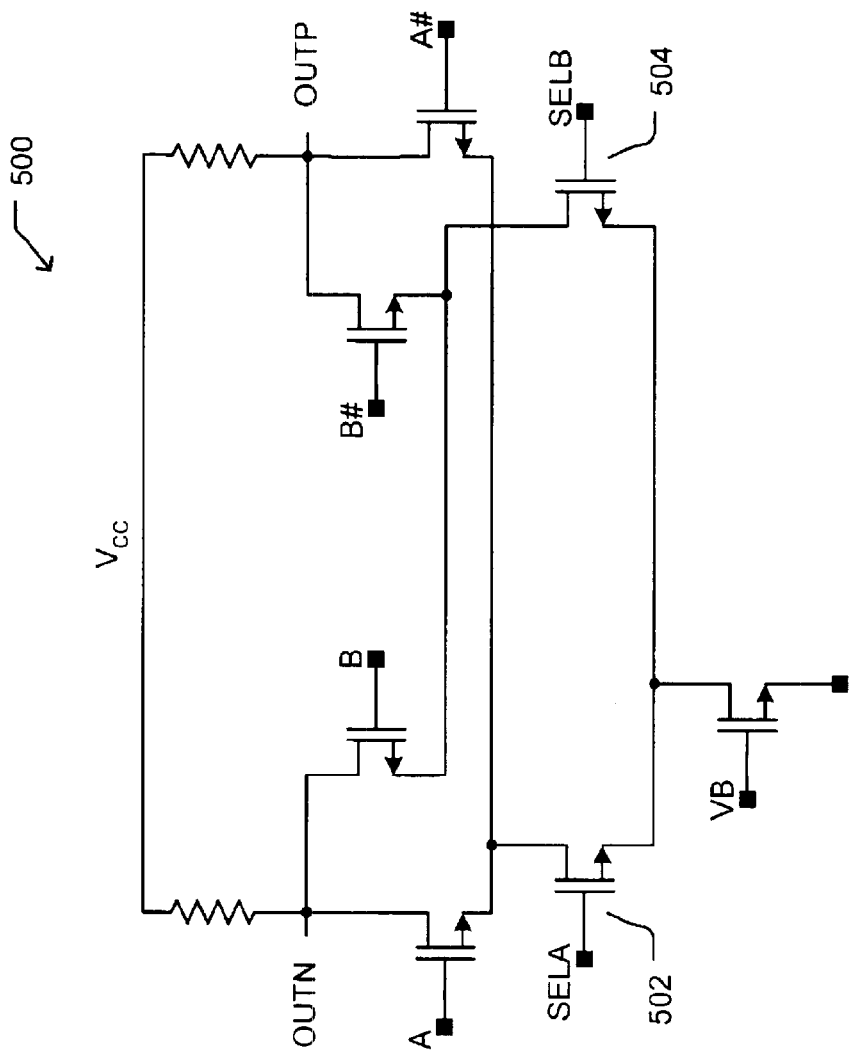
FIG. 5 shows an exemplary C³MOS implementation for a 2:1 multiplexer.

FIG. 5 shows an exemplary C$^3$MOS implementation for a 2:1 multiplexer 500. Similar to the other C$^3$MOS logic gates, multiplexer 500 includes a differential pair for each input, but multiplexer 500 further includes select transistors 502 and 504 inserted between the common source terminals of the differential pairs and the current source transistor in a cascade structure. By asserting one of the select input signals SELA or SELB, the bias current is steered to the differential pair associated with that select transistor. Thus, signal SELA steers the bias current to the differential pair with A and A# inputs, and signal SELB steers the bias current to the differential pair with B and B# inputs. Similar to gates 400 and 402, the signals SELA and SELB driving 15 inserted transistors 502 and 504 need level shifting to ensure proper switching operation of the circuit.

Figure 6:
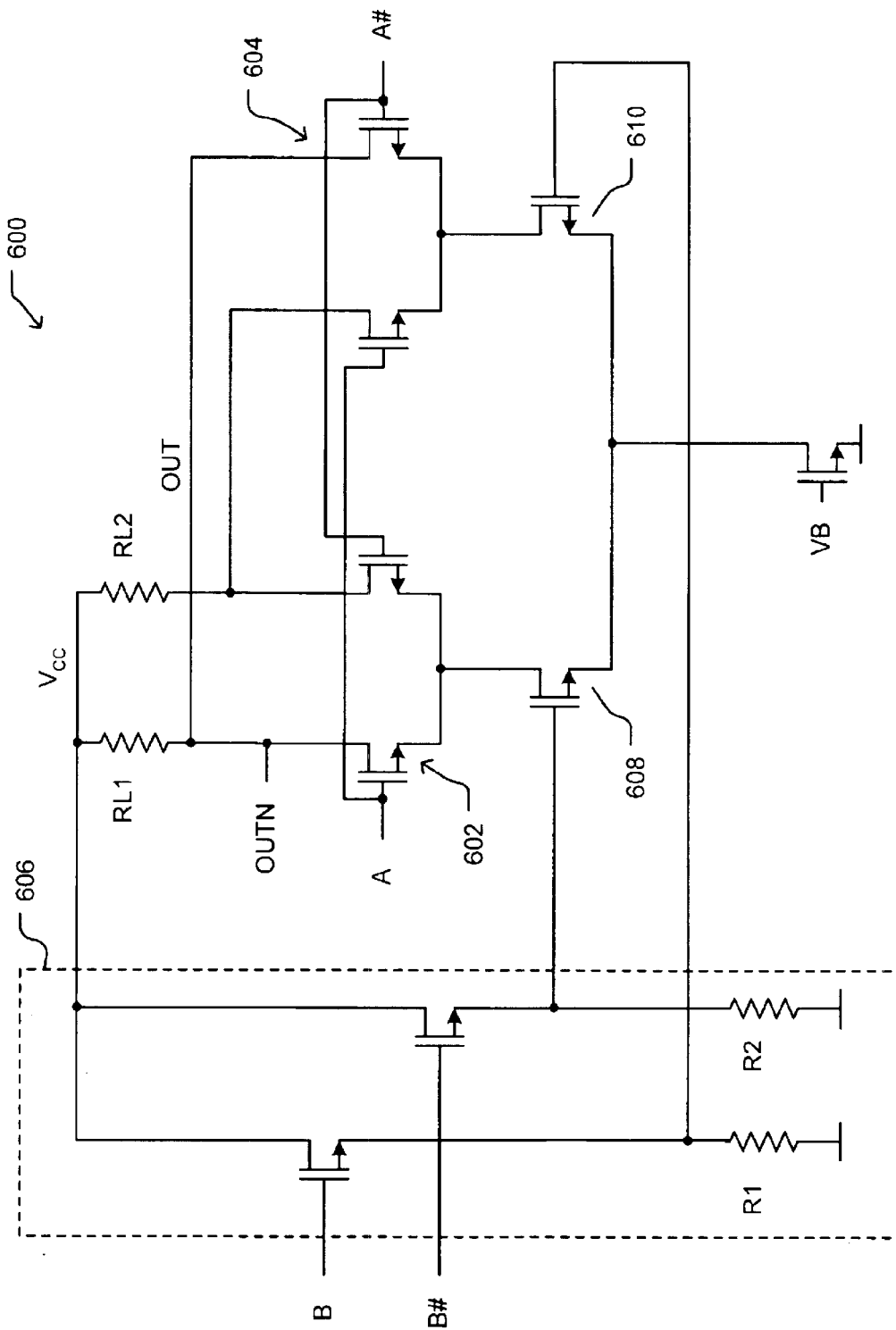
FIG. 6 shows an exemplary C³MOS implementation for a two-input exclusive OR/NOR gate.

FIG. 6 shows an exemplary C$^3$MOS implementation for a two-input exclusive OR (XOR) gate 600. This implementation includes two differential pairs 602 and 606 that share the same resistive load, receive differential signals A and A# at their inputs as shown, and have their drain terminals cross-coupled at the outputs. The other differential input signals B and B# are first level shifted by circuit 606 and then applied to cascade transistors 608 and 610 that are inserted between the differential pairs and the current source transistor. The circuit as thus constructed performs the XOR function on the two input signals A and B.

Figure 7:
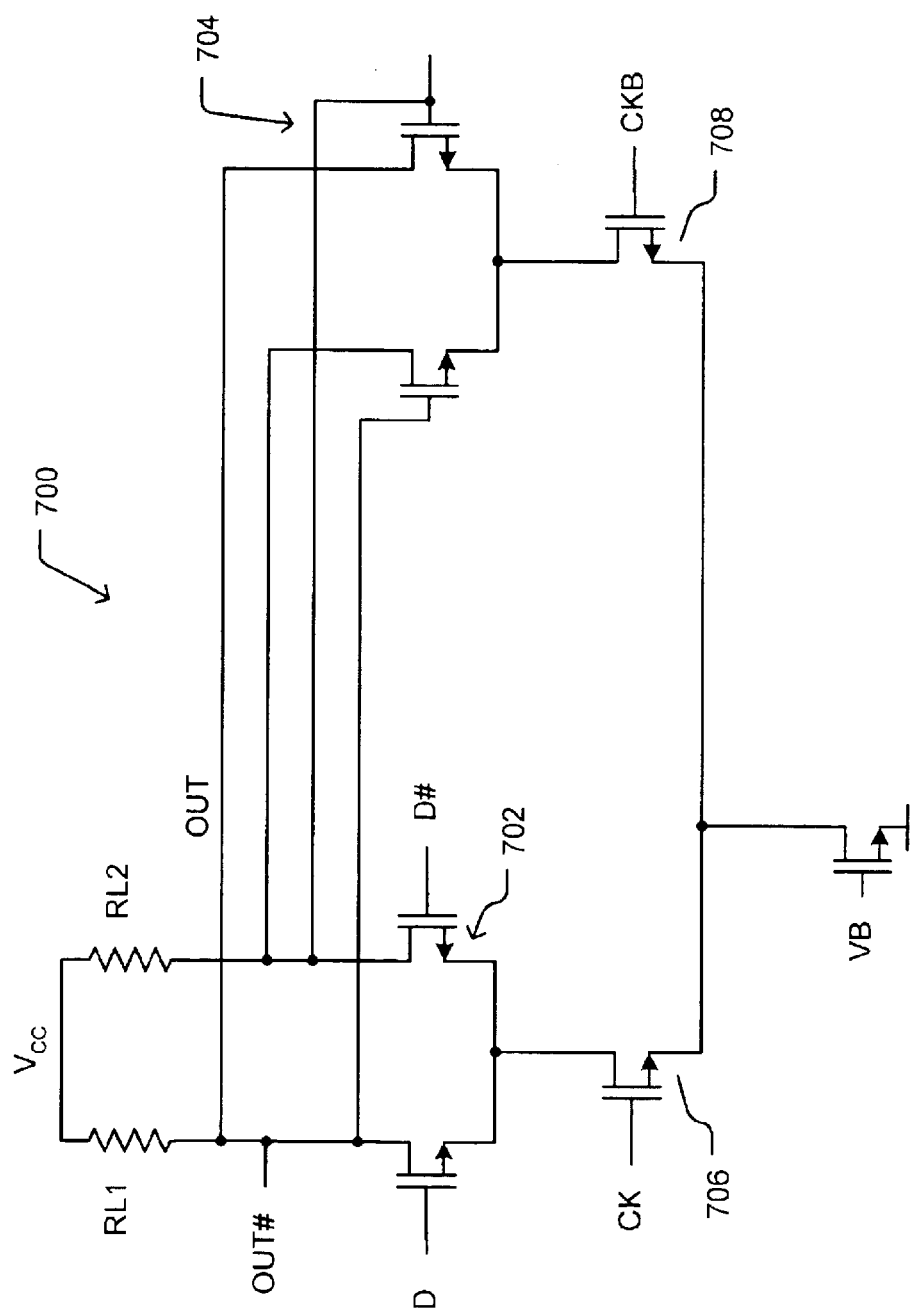
FIG. 7 is a circuit schematic showing an exemplary C³MOS clocked latch according to the present invention.

FIG. 7 is a circuit schematic showing an exemplary C$^3$MOS clocked latch 700 according to the present invention. Latch 700 includes a first differential pair 702 that receives differential inputs D and D# at the gate terminals, and a second differential pair 704 that has its gate and drain terminals cross-coupled to the outputs of OUT and OUT# first differential pair 702. Clocked transistors 706 and 708 respectively connect common-source nodes of differential pairs 702 and 704 to the current-source transistor. Complementary clock signals CK and CKB drive the gate terminals of clocked transistors 706 and 708. Similar to the other C$^3$MOS gates that have additional transistors inserted between the differential pair and the current-source transistor, clock signals CK and CKB are level shifted by level shift circuits such as that of FIG. 3.

Figure 8:
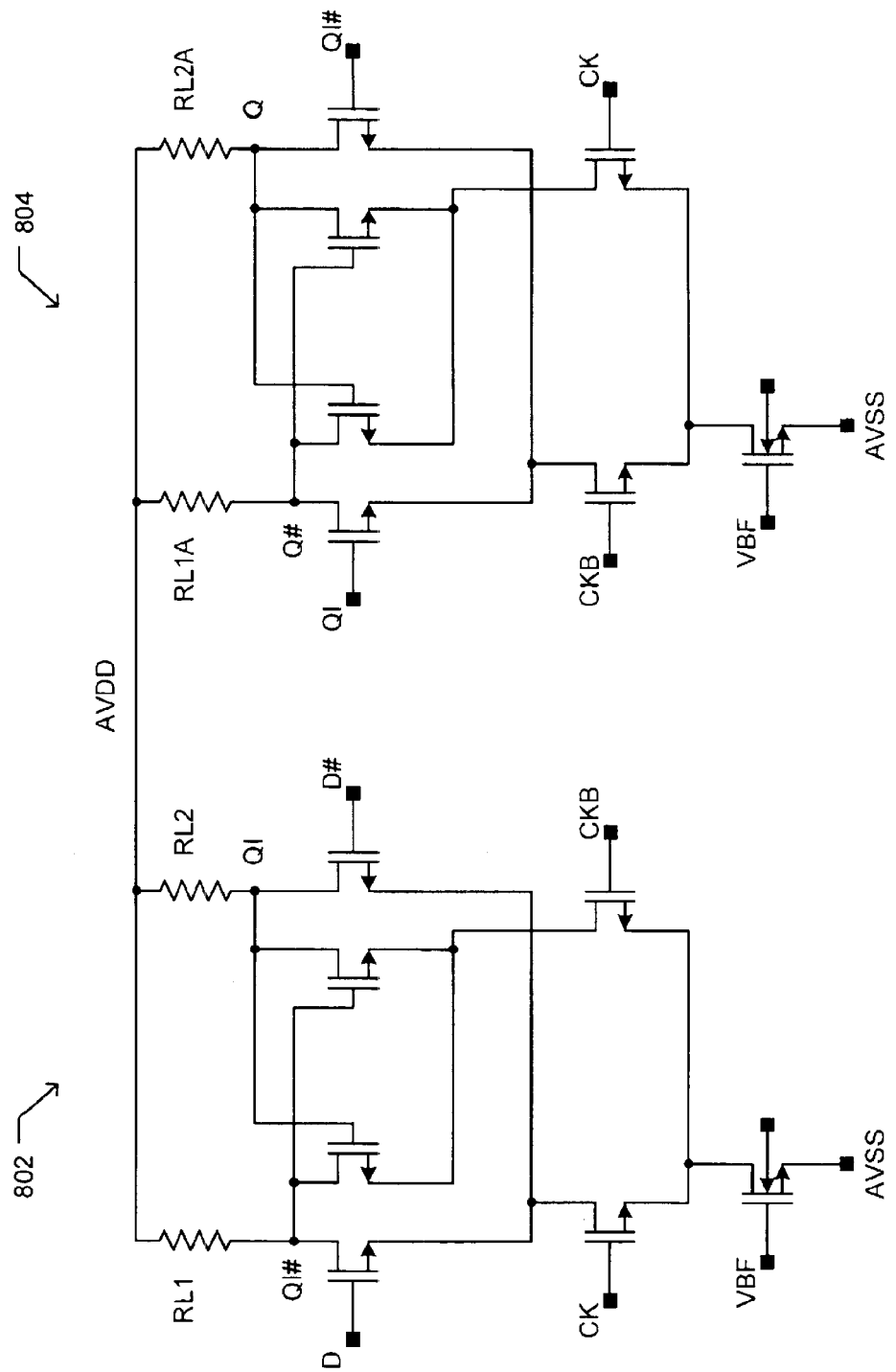
FIG. 8 is a circuit schematic for an alternate embodiment for a C³MOS flip-flop according to the present invention.

A C$^3$MOS master-slave flip-flop 800 according to the present invention can be made by combining two latches 700 as shown in FIG. 8. A first latch 802 receives differential input signals D and D# and generates differential output signals QI and QI#. The differential output signals QI and QI# are then applied to the differential inputs of a second latch 804. The differential outputs Q and Q# of second latch 804 provide the outputs of flip-flop 800.

Figure 9:
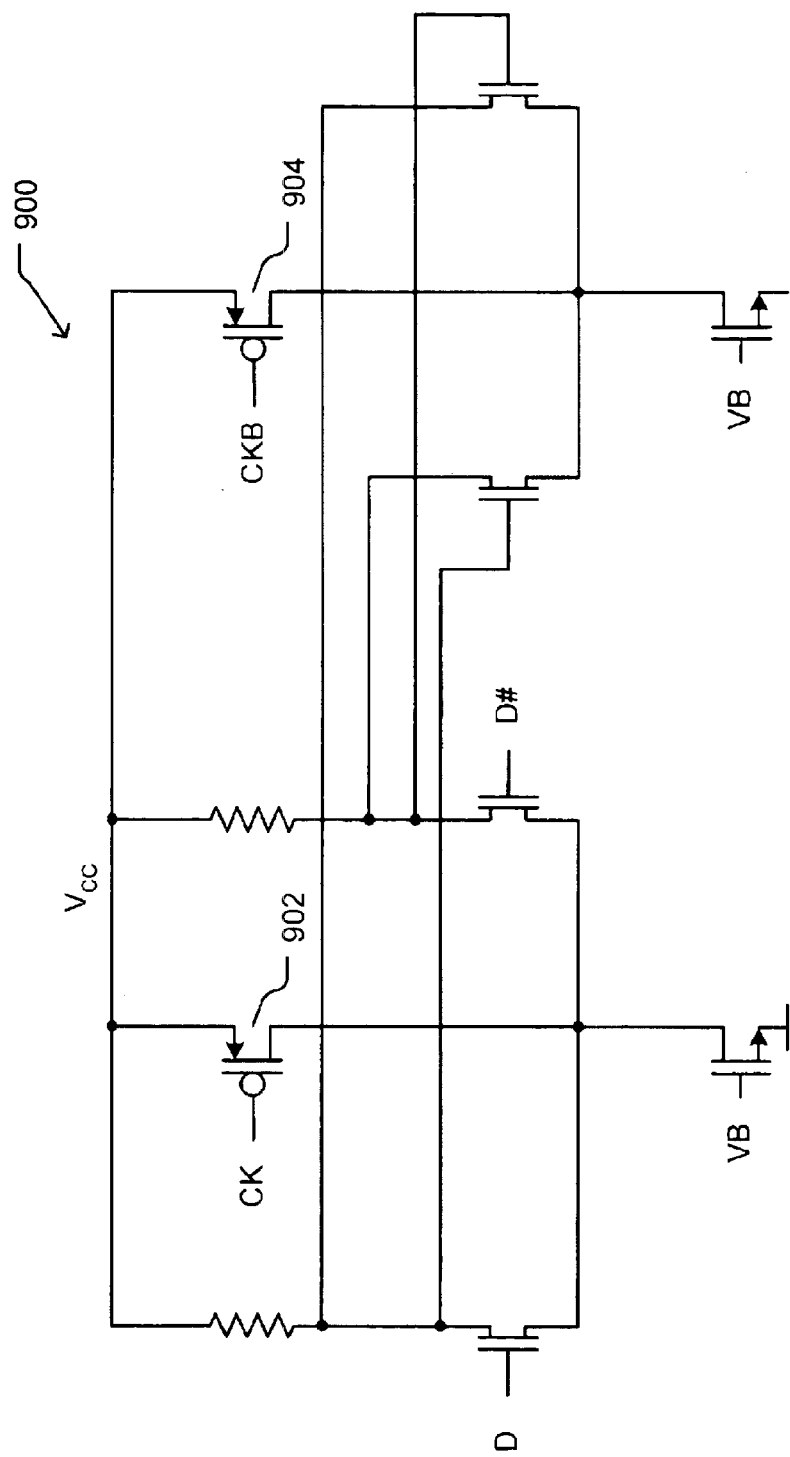
FIG. 9 shows an exemplary C³MOS implementation for a flip-flop using the C³MOS latch of FIG. 7.

Every one of the logic gates described thus far may be implemented using p channel transistors. The use of p-channel transistors provides for various alternative embodiments for C³MOS logic gates. FIG. 9 shows one example of an alternative implementation for a C³MOS clocked latch 900 that uses p-channel transistors. In this embodiment, instead of inserting the n-channel clocked transistors between the common-source nodes of the differential pairs and the current-source transistor, p channel clocked transistors 902 and 904 connect between the common-source nodes and the power supply Vcc. This implementation also requires that each differential pair have a separate current-source transistor as shown. Clocked latch 900 operates essentially the same as latch 700 shown in FIG. 7, except the implementation is not as efficient both in terms of size and speed.

Figure 10:
FIG. 10 shows a block diagram for a circuit that combines C³MOS and conventional CMOS logic on a single silicon substrate to achieve optimum tradeoff between speed and power consumption.

As illustrated by the various C³MOS logic elements described above, all of the building blocks of any logic circuitry can be constructed using the C³MOS technique of the present invention. More complex logic circuits such as shift registers, counters, frequency dividers, etc., can be constructed in C³MOS using the basic elements described above. As mentioned above, however, C³MOS logic does consume static power. The static current dissipation of C³MOS may become a limiting factor in certain large scale circuit applications. In one embodiment, the present invention combines C³MOS logic with conventional CMOS logic to achieve an optimum balance between speed and power consumption. According to this embodiment of the present invention, an integrated circuit utilizes C³MOS logic for the ultra high speed (e.g., GHz) portions of the circuitry, and conventional CMOS logic for the relatively lower speed sections. For example, to enable an integrated circuit to be used in ultra high speed applications, the input and output circuitry that interfaces with and processes the high speed signals is implemented using C³MOS. The circuit also employs C³MOS to divide down the frequency of the signals being processed to a low enough frequency where conventional CMOS logic can be used. The core of the circuit, according to this embodiment, is therefore implemented by conventional CMOS logic that consumes zero static current. FIG. 10 shows a simplified block diagram illustrating this exemplary embodiment of the invention. A C³MOS input circuit 1000 receives a high frequency input signal IN and outputs a divided down version of the signal IN/n. The lower frequency signal IN/n is then processes by core circuitry 1002 that is implemented in conventional CMOS logic. A C³MOS output circuit 1004 then converts the processed IN/n signal back to the original frequency (or any other desired frequency) before driving it onto the output node OUT.

Figure 11:
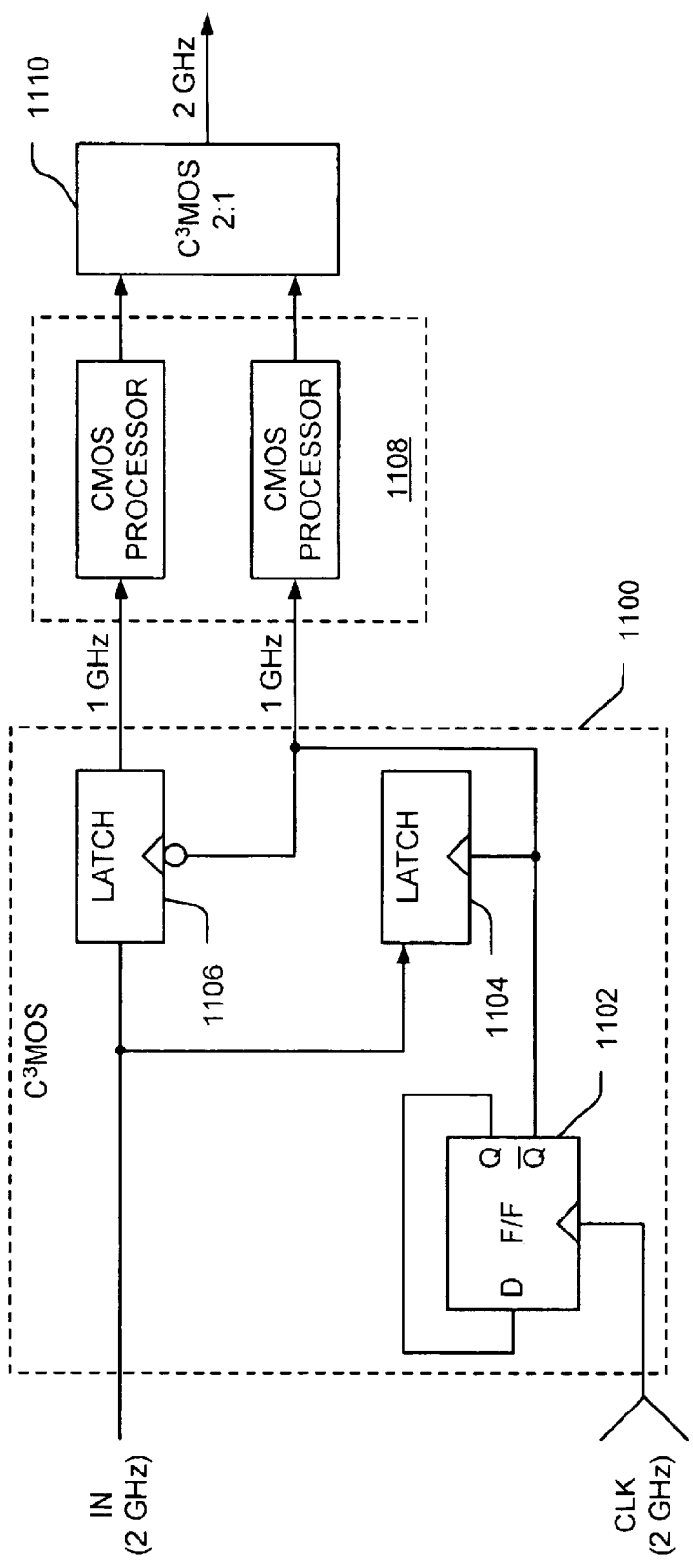
FIG. 11 shows an exemplary circuit application of the C³MOS/CMOS combined logic wherein C³MOS logic is used to deserialize and serialize the signal stream while CMOS logic is used as the core signal processing logic circuitry.

An example of a circuit implemented using combined CMOS/C³MOS logic according to the present invention is shown in FIG. 11. C³MOS input circuitry 1100 is a deserializer that receives a serial bit stream at a high frequency of, for example, 2 GHz. A 2 GHz input clock signal CLK is divided down to 1 GHz using a C³MOS flip-flop 1102, such as the one shown in FIG. 8, that is connected in a ÷2 feedback configuration. The 1 GHz output of flip-flop 1102 is then supplied to clock inputs of a pair of C³MOS latches 1104 and 1106. Latches 1104 and 1106, which may be of the type shown in FIG. 6, receive the 2 GHz input bit stream at their inputs and respectively sample the rising and falling edges of the input bit stream in response to the 1 GHz clock signal CLKI2. The signal CLKI2 which is applied to the B/B# inputs of each latch (the level shifted input; see FIG. 6), samples the input data preferably at its center. It is to be noted that the rise and fall times of the signal in CMOS logic is often very dependent on process variations and device matching. C³MOS logic, on the other hand, is differential in nature and therefore provides much improved margins for sampling.

Referring back to FIG. 11, block 11 thus deserializes the input bit stream with its frequency halved to allow for the use of conventional CMOS logic to process the signals. The signals at the outputs of latches 1104 and 1106 are applied to parallel processing circuitry 1108 that are implemented in conventional CMOS logic operating at 1 GHz. The reverse is performed at the output where a serializer 1110 receives the output signals from processing circuitry 1108 and serializes them using C³MOS logic. The final output signal is a bit stream with the original 2 GHz frequency. Circuit applications wherein this technique can be advantageously employed include high speed single or multi-channel serial links in communication systems.

As apparent from the circuit shown in FIG. 11, this technique doubles the amount of the core signal processing circuitry. However, since this part of the circuit is implemented in conventional CMOS logic, current dissipation is not increased by the doubling of the circuitry. Those skilled in the art appreciate that there can be more than one level of deserializing if further reduction in operating frequency is desired. That is, the frequency of the input signal can be divided down further by 4 or 8 or more if desired. As each resulting bit stream will require its own signal processing circuitry, the amount and size of the overall circuitry increases in direct proportion to the number by which the input signal frequency is divided. For each application, therefore, there is an optimum number depending on the speed, power and area requirements.

Figure 12:
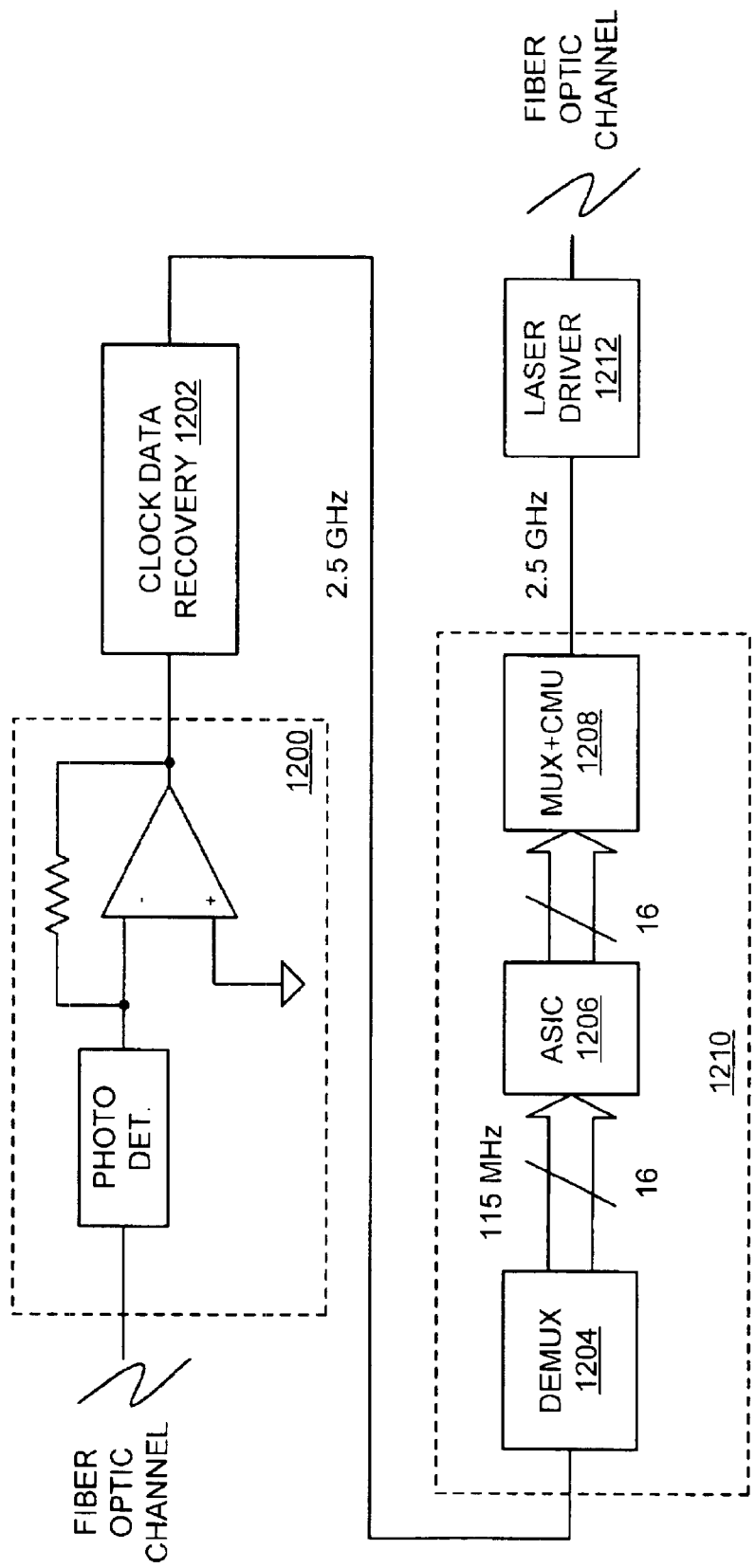
FIG. 12 is a simplified block diagram of a transceiver system that utilizes the C³MOS/CMOS combined logic according to the present invention to facilitate interconnecting high speed fiber optic communication channels.

According to one embodiment of the present invention the combined C³MOS/CMOS circuit technique as shown in FIG. 11 is employed in a transceiver of the type illustrated in FIG. 12. The exemplary transceiver of FIG. 12 is typically found along fiber optic channels in high speed telecommunication networks. The transceiver includes at its input a photo detect and driver circuit 1200 that receives the input signal from the fiber optic channel. Circuit 1200 converts fiber-optic signal to packets of data and supplies it to a clock data recovery (CDR) circuit 1202. CDR circuit 1202 recovers the clock and data signals that may be in the frequency range of about 2.5 GHz, or higher. Established telecommunication standards require the transceiver to perform various functions, including data monitoring and error correction. These functions are performed at a lower frequency. Thus, the transceiver uses a demultiplexer 1204 which deserializes the 2.5 GHz data stream into, for example, 16 parallel signals having a frequency of about 155 MHz. An application specific integrated circuit (ASIC) 1206 then performs the monitoring and error correction functions at the lower (155 MHz) frequency. A multiplexer and clock multiplication unit (CMU) 1208 converts the parallel signals back into a single bit stream at 2.5 GHz. This signal is then retransmitted back onto the fiber optic channel by a laser drive 1212. The combined C³MOS/CMOS technique of the present invention allows fabrication of demultiplexer 1204, ASIC 1206 and multiplexer and CMU 1208 on a single silicon die in a similar fashion as described in connection with the circuit of FIGS. 10 and 11. That is, demultiplexer 1204 and multiplexer and CMU 1208 are implemented in C³MOS with ASIC 1206 implemented in conventional CMOS.

According to another aspect of the present invention circuit speed is further enhanced by using a higher supply voltage for the C³MOS circuitry than that which may be specified by the CMOS fabrication process. The ongoing advances in semiconductor fabrication technology continue to make smaller and faster devices possible. The smaller geometries, however, often limit the voltage tolerance of the transistors. For example, while a thinner gate dielectric in an MOS transistor helps increase its speed of operation, the breakdown voltage at which damage may be caused to the transistor is also lowered. This reliability concern, as well as the desire to reduce power, have resulted in a downward trend in the permissible level of supply voltage for the modern sub-micron CMOS process. The lower power supply voltage, however, reduces the current density of the MOS transistor (i.e., lower transconductance) making the transistor slower. This is worse for CMOS circuitry using C³MOS logic where there are more than two devices stacked between the two power supplies. That is, instead of the two transistors 102 and 104 in the conventional CMOS inverter shown in FIG. 1, a typical C³MOS logic block such as buffer/inverter 200 of FIG. 2 has at least three devices, transistor 212, transistor 202 (or 204) and resistor 206 (or 208) between Vcc and ground. Therefore, buffer/inverter 200 has less voltage across its transistors. It also has a more limited output voltage swing. Moreover, the low voltage differential signaling (LVDS) technique that is often employed in high speed circuits may have a common mode voltage requirement that, for the C³MOS circuitry, would be too high to meet when using a lower power supply voltage.

According to one embodiment of the present invention a CMOS circuit combining both C³MOS logic as well as conventional CMOS logic is operated using two different power supply voltages. The C³MOS logic runs off of a first power supply voltage that is higher than the power supply voltage used for the conventional CMOS logic. The stacked nature of the C³MOS logic structure divides the power supply voltage across at least three stacked devices as opposed to only two. This enables it to receive a supply voltage that is higher than the maximum tolerable for conventional CMOS logic where there are only two devices between the supply rails. For example, today's 0.13µ CMOS process may specify power supply voltages no higher than 1.2 volts. A circuit according to this embodiment of the present invention can run the C³MOS portion off of a higher supply voltage of, e.g., 1.8 volts, while the CMOS portion of the circuit runs off of the prescribed 1.2 volt supply. Because the 1.8 volts is divided between at least one resistor and two transistors (as in the case of the C³MOS buffer/inverter of FIG. 2), the transistors do not experience excessive voltages between their terminals during operation. Also, because C³MOS circuitry 25 typically processes signals with smaller swings, it can withstand the higher supply voltage. The higher power supply voltage greatly improves the speed of the circuit as well as its ability to meet the required LVDS output level.

Figure 13:
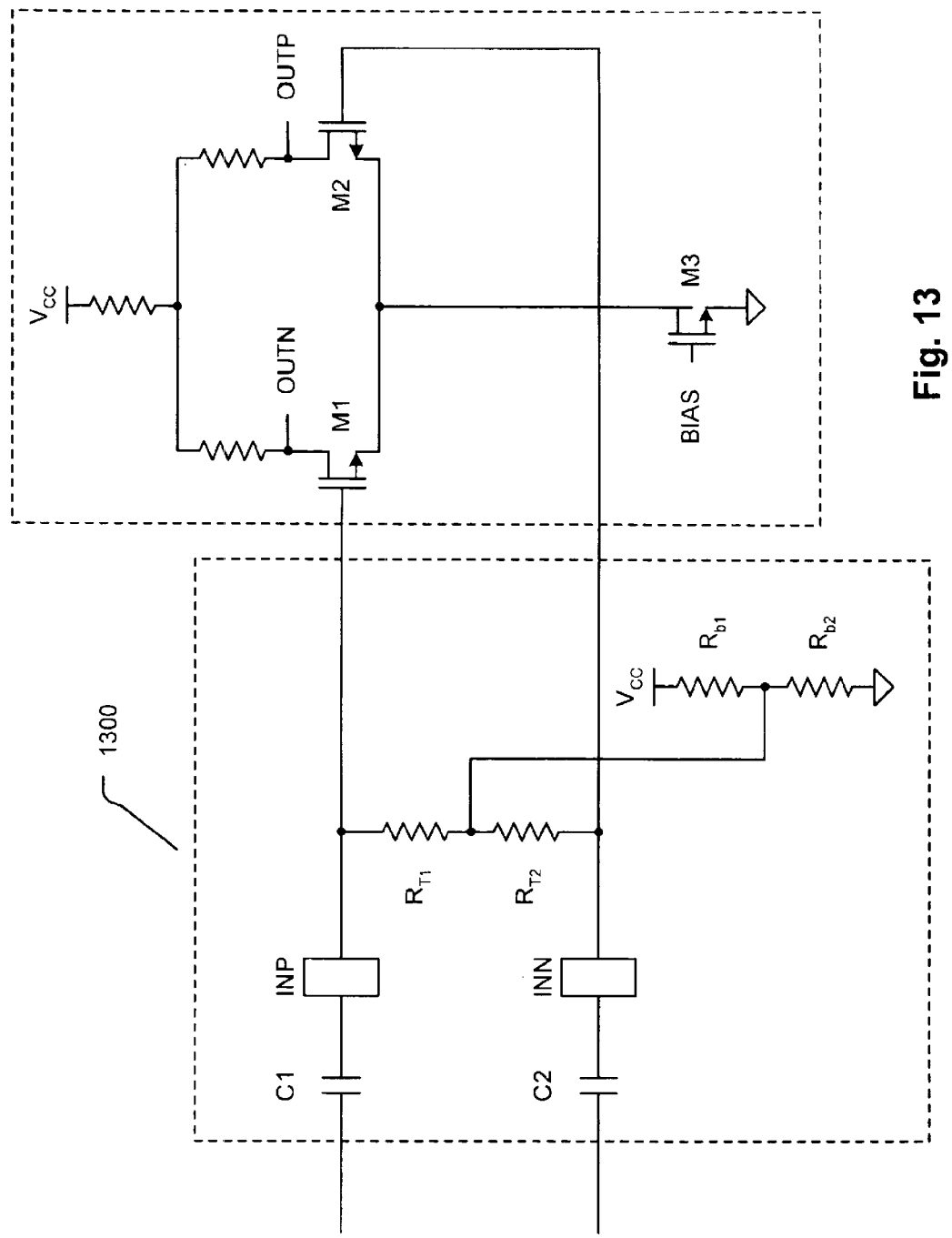
FIG. 13 illustrates an exemplary implementation for a pre-driver that biases the signal driving a C³MOS stage to optimize the speed of operation.

Referring to FIG. 13, there is shown an exemplary circuit implementation for a pre-driver signal conditioning circuit 1300 that may be used to maximize the speed of C³MOS logic according to an embodiment of the invention. Pre-driver 1300 drives the inputs of a C³MOS buffer/level shifter of the type shown in FIG. 3. To maximize the switching speed of the input transistors in the C³MOS stage (transistors M1 and M2), it is desirable to maintain these transistors operating in the saturation region. One way to accomplish this is to reduce the common mode level of the differential input signal driving the gate terminals of transistors M1 and M2. However, this would mean that with a lower power supply voltage at Vcc, the pre driver voltage would have to be even lower. A much reduced input signal level would leave very little voltage head-room for the tail transistor M3 requiring a larger M3 which would then add to the size of the circuit as well as the parasitics. By using a higher supply voltage than the maximum specified by the process, the present invention allows pre-driver 1300 to operate at a higher voltage. This allows the input transistors M1 and M2 to remain in the saturation region without the need for a larger trail transistor M3. Depending on the embodiment, the higher voltage operation may push transistors M1 and M2 in deep saturation to even greater speed. As a result, the overall speed of the circuit is much enhanced. In the exemplary embodiment shown in FIG. 13, pre-driver circuit 1300 includes a pair of AC coupling capacitors C1 and C2 respectively connecting to input terminals INP and INN. A pair of termination resistors RT1 and RT2 connect across the input terminals INP and INN, and a voltage divider made of a pair of resistors Rb1 and Rb2 set the common mode bias voltage for the input signal. Other implementations are possible.

Figure 14:
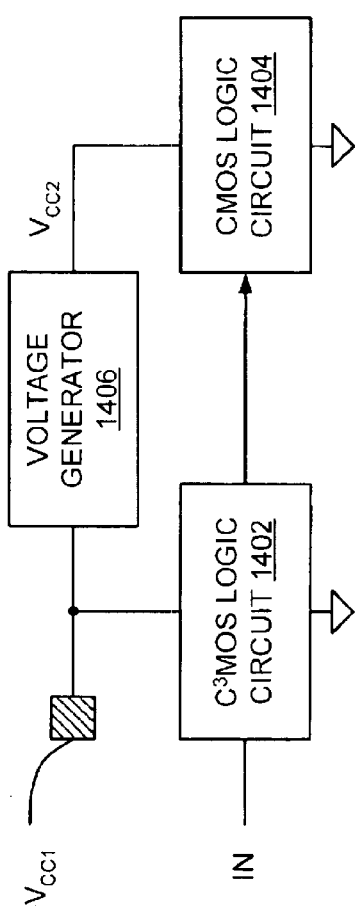
FIG. 14 is a simplified block diagram of an exemplary circuit according to a specific embodiment of the present invention that combines C³MOS logic circuitry running at a higher power supply voltage with conventional CMOS logic circuitry running at a lower power supply voltage.
Figure 15:
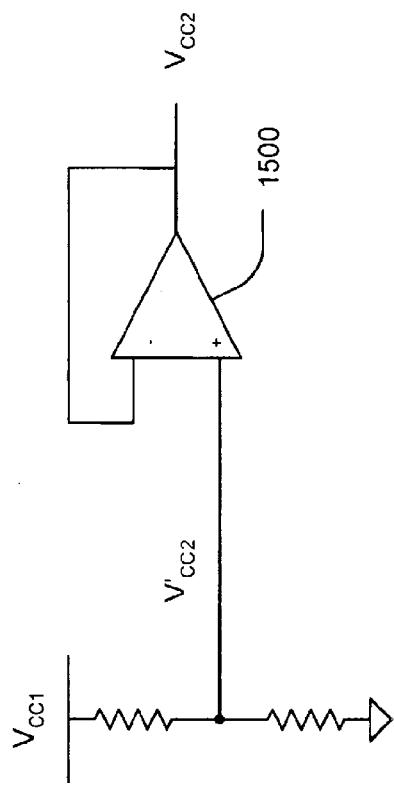
FIG. 15 is an exemplary circuit implementation for a voltage generator that uses a higher C³MOS power supply voltage to generate a lower CMOS power supply voltage.

The dual power supply embodiment of the present invention can be implemented in a number of ways. In one embodiment, two separate supply voltages can be applied externally. The higher voltage would be applied to the C³MOS logic circuitry and the lower voltage to the conventional CMOS logic circuitry. This embodiment would require two external pins for the chip. An alternative embodiment receives only one power supply voltage and generates the other on-chip. Referring to FIG. 14 there is shown a simplified block diagram of a circuit 1400 operating with two different supply voltages Vcc1 for C³MOS logic circuitry 1402 and Vcc2 for conventional CMOS logic circuitry 1404. A voltage generator 1406 receives Vcc1 and generates the second supply voltage Vcc2 for use with conventional CMOS logic circuitry 1404. A variety of circuit implementations are known for voltage generator 1404. FIG. 15 shows a simplified example of a circuit implementation for voltage generator 1406. A voltage divider made up of resistors Rd1 and Rd2 connect between the first power supply voltage Vcc1 and ground. Resistors Rd 1 and Rd2 sized to generate the desired second voltage level Vcc2'. An amplifier 1500 connected in a unity gain configuration provides a buffer between the divider and the output Vcc2 that is to be used by the conventional CMOS logic circuitry.

In conclusion, the present invention provides various circuit techniques for implementing ultra high speed circuits using current-controlled CMOS (C³MOS) logic fabricated in conventional CMOS process technology. An entire family of logic elements including inverter/buffers, level shifters, NAND, NOR, XOR gates, latches, flip-flops and the like have been developed using C³MOS according to the present invention. In one embodiment, the present invention advantageously combines high speed C³MOS logic with low power conventional CMOS logic. According to this embodiment circuits such as transceivers along fiber optic channels can be fabricated on a single chip where the ultra-high speed portions of the circuit utilize C³MOS and the relatively lower speed parts of the circuit use conventional CMOS logic. In another embodiment, the C³MOS logic circuitry receives a first power supply voltage that is higher than the power supply voltage used by the conventional CMOS logic circuitry. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A metal-oxide-semiconductor field-effect transistor (MOSFET) circuit fabricated on a silicon substrate, comprising:

first circuitry implemented using current-controlled complementary metal-oxide semiconductor ($C^3MOS$) logic wherein logic levels are signaled by current steering in one of two or more branches in response to differential input signals, the first circuitry is operable to process a first signal thereby generating a second signal;

second circuitry coupled to the first circuitry and implemented using conventional complementary metal-oxide-semiconductor (CMOS) logic wherein substantially zero static current is dissipated, the second circuitry is operable to process the second signal thereby generating a third signal;

wherein the first circuitry is coupled to a first power supply voltage;

wherein the second circuitry is coupled to a second power supply voltage that is different than the first power supply voltage; and wherein the first power supply voltage is higher in magnitude than the second power supply.

2. The circuit of claim 1, further comprising:

third first circuitry implemented using $C^3MOS$ logic wherein logic levels are signaled by current steering in one of two or more branches in response to differential input signals, the third circuitry being configured to process the third signal thereby generating a fourth signal.

3. The circuit of claim 2, wherein:

the third circuitry is coupled to the first power supply voltage.

4. The circuit of claim 2, wherein:

the first signal has a first frequency;

the second signal has a second frequency that is different than the first frequency;

the third signal has the second frequency; and the fourth signal has the first frequency.

5. The circuit of claim 4, wherein:

the second frequency is lower than the first frequency.

6. The circuit of claim 2, wherein:

the first signal has a first frequency;

the second signal includes a first plurality of signals, each signal of the first plurality of signals has a second frequency that is different than the first frequency;

the third signal includes a second plurality of signals, each signal of the second plurality of signals has the second frequency; and the fourth signal has the first frequency.

7. The circuit of claim 6, wherein:

the second frequency is lower than the first frequency.

8. The circuit of claim 2, wherein:

the first signal has a first frequency;

the first circuitry is a demultiplexer that is operable to deserialize the first signal thereby generating the second signal that includes a first plurality of signals, each signal of the first plurality of signals has a second frequency that is different than the first frequency;

the second circuitry is an application specific integrated circuit (ASIC) that is operable to perform data monitoring and error correction when processing each signal of the first plurality of signals within the second signal thereby generating the third signal that includes a second plurality of signals, each signal of the second plurality of signals has the second frequency;

the third circuitry is a multiplexer and clock multiplication unit (CMU) that is operable to serialize each signal of the second plurality of signals within the third signal thereby generating the fourth signal; and the fourth signal has the first frequency.

9. The circuit of claim 1, further comprising:

a voltage generator that is operable to receive the first power supply voltage and to generate the second power supply voltage there from.

10. A metal-oxide-semiconductor field-effect transistor (MOSFET) circuit fabricated on a silicon substrate, comprising:

first circuitry implemented using current-controlled complementary metal-oxide semiconductor ($C^3MOS$) logic wherein logic levels are signaled by current steering in one of two or more branches in response to differential input signals, the first circuitry is operable to process a first signal thereby generating a second signal;

second circuitry coupled to the first circuitry and implemented using conventional complementary metal-oxide-semiconductor (CMOS) logic wherein substantially zero static current is dissipated, the second circuitry is operable to process the second signal thereby generating a third signal;

third circuitry implemented using $C^3MOS$ logic wherein logic levels are signaled by current steering in one of two or more branches in response to differential input signals, the third circuitry being configured to process the third signal thereby generating a fourth signal;

wherein the first circuitry is coupled to a first power supply voltage;

wherein the second circuitry is coupled to the second power supply voltage that is different than the first power supply voltage;

wherein the second power supply voltage is generated on-chip from the first power supply voltage; and wherein the third circuitry is coupled to the first power supply voltage.

11. The circuit of claim 10, further comprising:

a voltage generator that is operable to receive the first power supply voltage and to generate the second power supply voltage there from.

12. The circuit of claim 10, wherein:

the first signal has a first frequency;

the second signal has a second frequency that is different than the first frequency;

the third signal has the second frequency; and the fourth signal has the first frequency.

13. The circuit of claim 12, wherein:

the second frequency is lower than the first frequency.

14. The circuit of claim 10, wherein:

the first signal has a first frequency;

the second signal includes a first plurality of signals, each signal of the first plurality of signals has a second frequency that is different than the first frequency;

the third signal includes a second plurality of signals, each signal of the second plurality of signals has the second frequency; and the fourth signal has the first frequency.

15. The circuit of claim 14, wherein:
the second frequency is lower than the first frequency.

16. The circuit of claim 10, wherein:
the first signal has a first frequency;
the first circuitry is a demultiplexer that is operable to deserialize the first signal thereby generating the second signal that includes a first plurality of signals, each signal of the first plurality of signals has a second frequency that is different than the first frequency;
the second circuitry is an application specific integrated circuit (ASIC) that is operable to perform data monitoring and error correction when processing each signal of the first plurality of signals within the second signal thereby generating the third signal that includes a second plurality of signals, each signal of the second plurality of signals has the second frequency;
the third circuitry is a multiplexer and clock multiplication unit (CMU) that is operable to serialize each signal of the second plurality of signals within the third signal thereby generating the fourth signal; and
the fourth signal has the first frequency.

17. The circuit of claim 10, wherein:
the first power supply voltage is higher in magnitude than the second power supply.

18. A metal-oxide-semiconductor field-effect transistor (MOSFET) circuit fabricated on a silicon substrate, comprising:
a demultiplexer implemented using current-controlled complementary metal-oxide semiconductor ($C^3MOS$) logic wherein logic levels are signaled by current steering in one of two or more branches in response to differential input signals;
wherein the demultiplexer is operable to deserialize a first signal having a first frequency thereby generating a second signal that includes a first plurality of signals, each signal of the first plurality of signals has a second frequency that is different than the first frequency;
an application specific integrated circuit (ASIC) coupled to the demultiplexer and implemented using conventional complementary metal-oxide-semiconductor (CMOS) logic wherein substantially zero static current is dissipated;
wherein the ASIC is operable to perform data monitoring and error correction when processing each signal of the first plurality of signals within the second signal thereby generating a third signal that includes a second plurality of signals, each signal of the second plurality of signals has the second frequency
a multiplexer and clock multiplication unit (CMU) implemented using $C^3MOS$ logic wherein logic levels are signaled by current steering in one of two or more branches in response to differential input signals;
wherein the multiplexer and CMU is operable to serialize each signal of the second plurality of signals within the third signal thereby generating a fourth signal;
wherein the demultiplexer is coupled to a first power supply voltage;
wherein the ASIC is coupled to the second power supply voltage that is different than the first power supply voltage; and
wherein the multiplexer and CMU is coupled to the first power supply voltage.

19. The circuit of claim 18, wherein:
the second power supply voltage is generated on-chip from the first power supply voltage.

20. The circuit of claim 18, wherein:
the first power supply voltage is higher in magnitude than the second power supply.

* * * * *

UNITED STATES PATENT AND TRADEMARK OFFICE
CERTIFICATE OF CORRECTION

PATENT NO. : 6,982,583 B2
APPLICATION NO. : 10/876790
DATED : January 3, 2006
INVENTOR(S) : Guangming Yin et al.

It is certified that error appears in the above-identified patent and that said Letters Patent is hereby corrected as shown below:

Column 11, line 27, in Claim 1: after "supply" insert --voltage--

Column 13, line 24, in Claim 17: after "supply" insert --voltage--

Column 14, line 13, in Claim 18: after "frequency" insert --;--

Column 14, line 33, in Claim 20: after "supply" insert --voltage--

Signed and Sealed this

Fifteenth Day of July, 2008

JON W. DUDAS
*Director of the United States Patent and Trademark Office*